United States Patent
Rozgo et al.

(10) Patent No.: US 8,230,745 B2
(45) Date of Patent: Jul. 31, 2012

(54) WET/WET DIFFERENTIAL PRESSURE SENSOR BASED ON MICROELECTRONIC PACKAGING PROCESS

(75) Inventors: Paul Rozgo, Dublin, OH (US); Alistair Bradley, Dublin, OH (US); Ryan S. Jones, Dublin, OH (US); Lamar F. Ricks, Lewis Center, OH (US)

(73) Assignee: Honeywell International Inc., Morristown, NJ (US)

( * ) Notice: Subject to any disclaimer, the term of this patent is extended or adjusted under 35 U.S.C. 154(b) by 495 days.

(21) Appl. No.: 12/273,960

(22) Filed: Nov. 19, 2008

(65) Prior Publication Data

US 2010/0122583 A1  May 20, 2010

(51) Int. Cl.
G01L 13/02 (2006.01)
G01L 15/00 (2006.01)

(52) U.S. Cl. ............... 73/716; 73/715; 73/721; 73/753; 73/754

(58) Field of Classification Search ............... None
See application file for complete search history.

(56) References Cited

U.S. PATENT DOCUMENTS

| | | | |
|---|---|---|---|
| 4,023,562 A | 5/1977 | Hynecek et al. | |
| 4,380,932 A | 4/1983 | Mott et al. | |
| 4,942,383 A | 7/1990 | Lam et al. | 338/42 |
| 5,184,107 A * | 2/1993 | Maurer | 338/42 |
| 5,257,547 A * | 11/1993 | Boyer | 73/756 |
| 5,264,820 A | 11/1993 | Kovacich et al. | |
| 5,437,189 A | 8/1995 | Brown et al. | |
| 5,522,267 A * | 6/1996 | Lewis | 73/726 |
| 5,557,972 A * | 9/1996 | Jacobs et al. | 73/756 |
| 5,589,703 A | 12/1996 | Baskett | |
| 5,600,071 A * | 2/1997 | Sooriakumar et al. | 73/721 |
| 5,646,072 A * | 7/1997 | Maudie et al. | 438/51 |
| 5,684,253 A | 11/1997 | Bonne et al. | |
| 6,148,673 A * | 11/2000 | Brown | 73/721 |
| 6,150,681 A * | 11/2000 | Allen | 257/254 |
| 6,255,728 B1 | 7/2001 | Nasiri et al. | |
| 6,346,742 B1 | 2/2002 | Bryzek et al. | |
| 6,427,539 B1 | 8/2002 | Chen et al. | |
| 6,945,120 B1 | 9/2005 | Marcus et al. | |
| 6,959,607 B2 | 11/2005 | Wilda | |

(Continued)

FOREIGN PATENT DOCUMENTS

JP        59005931 A  *  1/1984

(Continued)

Primary Examiner — Lisa Caputo
Assistant Examiner — Jermaine Jenkins
(74) Attorney, Agent, or Firm — Seager Tufte & Wickhem LLC

(57) ABSTRACT

Method and system for a wet/wet differential pressure sensor based on microelectronic packaging process. A top cap with a hole can be attached to a topside of a MEMS-configured pressure sense die with a pressure sensing diaphragm in order to allow sensed media to come in contact with the topside of the pressure sensing diaphragm. An optional constraint with a hole for stress relief can be attached to a backside of the pressure sense die. Adhesive and/or elastomeric seals and/or solder can be utilized to seal the pressure sense die allowing sensed media to come in contact with both sides of the pressure sensing diaphragm without coming into contact with wirebonds and other metallized surfaces. The MEMS-configured pressure sense die can also be bonded to a substrate with standard die attach materials. Such microelectronic packaging processes yield a high performance and cost effective solution thereby providing wet-wet pressure sensing capability.

20 Claims, 3 Drawing Sheets

U.S. PATENT DOCUMENTS

| | | | |
|---|---|---|---|
| 7,004,033 B2 * | 2/2006 | Katayama | 73/706 |
| 7,010,984 B2 | 3/2006 | Krog et al. | |
| 7,028,552 B2 * | 4/2006 | Obermeier | 73/754 |
| 7,162,927 B1 | 1/2007 | Selvan et al. | 73/753 |
| 7,216,547 B1 * | 5/2007 | Stewart et al. | 73/756 |
| 7,219,551 B2 | 5/2007 | Suzuki | |
| 7,252,007 B2 | 8/2007 | Ruohio et al. | 73/718 |
| 7,343,080 B2 | 3/2008 | Gally et al. | 385/147 |
| 7,395,718 B2 * | 7/2008 | Obermeier | 73/754 |
| 7,401,525 B2 | 7/2008 | Cobianu et al. | |
| 7,436,037 B2 | 10/2008 | Kurtz et al. | |
| 7,526,963 B2 * | 5/2009 | Wanami et al. | 73/753 |
| 7,644,625 B2 * | 1/2010 | Ricks | 73/756 |
| 7,763,487 B2 | 7/2010 | Villa et al. | |
| 7,765,978 B2 | 8/2010 | Ruesch et al. | |
| 7,775,117 B2 * | 8/2010 | Kurtz | 73/721 |
| 2008/0061799 A1 | 3/2008 | Kim et al. | 324/658 |
| 2008/0066559 A1 | 3/2008 | Johansen et al. | 73/861.63 |
| 2009/0288492 A1 | 11/2009 | Stewart et al. | |

FOREIGN PATENT DOCUMENTS

| | | |
|---|---|---|
| JP | 06-026963 | 2/1994 |
| JP | 11258094 | 9/1999 |
| JP | 3863171 | 10/2006 |
| KR | 20080031969 | 4/2008 |

* cited by examiner

US 8,230,745 B2

WET/WET DIFFERENTIAL PRESSURE SENSOR BASED ON MICROELECTRONIC PACKAGING PROCESS

TECHNICAL FIELD

Embodiments are generally related to sensor methods and systems. Embodiments are also related to differential pressure sensor for use in wet/wet applications. Embodiments are also related to differential pressure sensor designs based on microelectronic and/or MEMS (Micro electromechanical System) packaging processes.

BACKGROUND OF THE INVENTION

Pressure sensors or pressure transducers can be utilized in a wide range of sensing applications. In many cases, it is desirable to measure the pressure of a particular type of media (e.g., usually gases or liquids) such as water, fuel, oil, acids, bases, solvents and corrosive gases. The sensed media can also include (but need not be limited to) air, nitrogen, industrial process gases, water, automotive fluids, pneumatic fluids, coolants, industrial chemicals, etc. For such applications, pressure sensors can be utilized to accurately sense the pressure of the media.

In particular, one type or configuration of pressure sensor is referred to as a differential pressure sensor. This type of sensor measures the difference between two or more pressures that are supplied as inputs. An example application for a differential pressure sensor may involve measuring the pressure drop across a furnace filter or an oil filter to determine the level of clogging. Another differential pressure sensor application may be implemented in conjunction with the venturi effect to measure flow. In such a situation, a pressure differential can be created between two segments of a venturi tube that are designed with a different aperture. The pressure difference is directly proportional to the flow rate through the venturi tube and can be accurately measured by a differential pressure sensor.

One of the most common types of differential pressure sensors utilized in many industrial and commercial applications is a solid-state MEMS pressure sensor that utilizes silicon piezoresistive technology. A typical MEMS pressure die employs a thin silicon diaphragm that is stressed in response to an applied pressure. Piezoresistors are strategically located or positioned on the diaphragm. When pressure is applied to the sensor, the diaphragm is stressed and the piezoresistors convert this mechanical stress to an electrical signal. Typically, the piezoresistors form a Wheatstone bridge and the differential signal is proportional to the applied pressure.

In wet applications, the pressure sensor comes into contact with liquids or with gases having high moisture content. The differential pressure sensors can also be utilized in wet/wet applications where both sides of the sense die are exposed to the sensed media such as water or oil. Such differential pressure sensors can require the fluid media on both the top and bottom sides of the diaphragm. Hence the diaphragm of the differential pressure sensor can come into contact with the media that can be usually corrosive or harmful. This corrosive or harmful media can damage components of the pressure sensors, in particular bond pads that are exposed electrical connection to the differential pressure sensor.

In many applications, even if the media itself is not electrically conducting it can create a harsh environment for the exposed bond pads, resulting in long-term reliability failures. Hence, it is desirable to isolate sensing elements, circuitry and electrical connections from direct contact with the media for reliable operation. However there are very few cost effective solutions for a wet-wet pressure sensor. Most solutions are based on stainless steel isolation diaphragm design construction utilizing oil filled media isolated silicon piezoresistive technology. In some isolation arrangements of the differential pressure sensors, the environmentally sensitive silicon pressure die can be sandwiched between elastomeric seals one of which includes a conductive stack for electrical connection. The pressure sensors can utilize the pre-molded elastomeric seals to separate the pressure die from a relatively harsh, wet, pressure sensing environment. Such pressure sensors can obtain a true differential operation and an accurate pressure of the media, but the increased production and material costs can be prohibitive. Also, one problem which can be associated with such pressure sensors is thermal hysteresis associated with the elastomeric seals, which flex and move over temperature, thus causing shifts in the parametric performance of the device.

A need therefore exists for an improved differential pressure sensor with high reliability for wet/wet applications, which can provide media isolated electrical connections that are ultimately more efficient and robust than presently implemented pressure sensors. Such differential pressure sensors are described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved sensor method and system.

It is another aspect of the present invention to provide for an improved topside cap differential pressure sensor with a hole that can overcome the aforementioned drawbacks.

It is further aspect of the present invention to provide for an improved method for assembling a differential pressure sensor with media isolated electrical connections for wet-wet applications based on microelectronic packaging process.

The aforementioned aspects and other objectives and advantages can now be achieved as described herein. A method and system for a wet/wet differential pressure sensor based on microelectronic packaging process is disclosed. A top cap with a hole can be attached to the topside of a MEMS-configured pressure sense die with a pressure sensing diaphragm in order to allow sensed media to come in contact with the topside of the pressure sensing diaphragm. An optional constraint with a hole for stress relief can be attached to a backside of the pressure sense die. Adhesive and/or solder and/or elastomeric seals can be utilized to seal the pressure sense die allowing sensed media to come in contact with both sides of the pressure sensing diaphragm without coming into contact with wirebonds and other exposed metallized surfaces on the topside of the pressure sense die. The MEMS-configured pressure sense die can also be bonded to a substrate with standard die attach materials. Such microelectronic packaging processes yield a high performance and cost effective solution that possess true wet-wet pressure sensing capability. The top cap and the optional constraint comprised of glass and/or silicon can be attached with standard wafer bonding processes such as anodic bonding or glass frit bonding.

A pair of pressure ports can be provided at the top and bottom of the package to allow the pressures to act on the pressure-sensing diaphragm. Sealing at the hole in the top cap provides protection by isolating wirebonds, wire bonding pads and other exposed circuitry from the sensed media. The diaphragm can be deformed in accordance with the pressure applied by the media. The deformation can be measured by piezoresistive elements doped on a surface of the diaphragm. The piezoresistive elements can convert the deformation of the diaphragm into electrical signals utilizing well-known piezoresistive principles in order to compute the pressure in the media. Adhesive and/or solder and/or elastomeric seal on either or both the top and bottom surfaces of the sense die can be utilized to achieve connections to a variety of pressure ports. Such a robust design solution for pressure sensing applications provides wet-wet media compatibility so that wet media comes into contact with both sides of the sensing diaphragm and not with other parts which may be damaged by exposure to the media.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
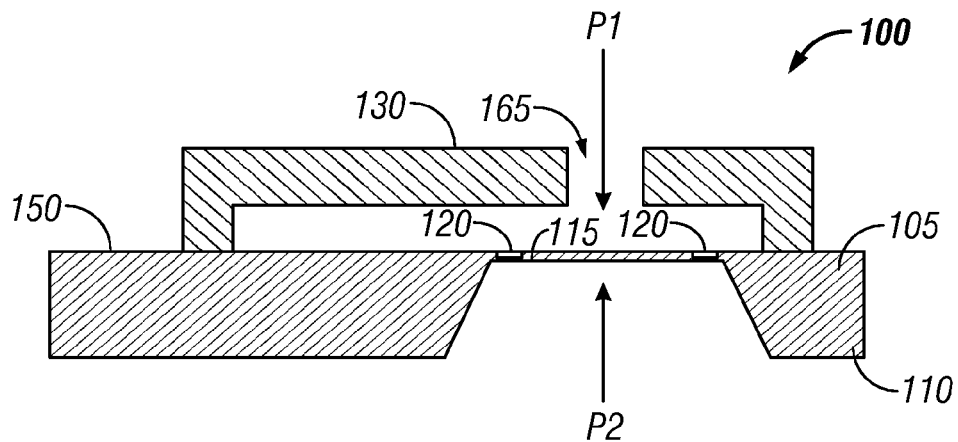
FIG. 1 illustrates a cross sectional view of a MEMS-configured pressure sensor with a top cap for wet-wet applications, which can be adapted for use in implementing a preferred embodiment.

A MEMS-configured pressure sensor design utilizing wafer fabrication processes and microelectronic packaging techniques is disclosed herein. In such a device, a differential pressure sensor with high isolation between the sensed media and the sensor's electronics can be implemented. Referring to FIG. 1, a cross sectional view of a differential pressure sensor 100 is illustrated, in accordance with a preferred embodiment. Note that in FIGS. 1-4, identical or analogous parts or elements are generally indicated by identical reference numerals. The pressure sensor 100 generally includes a MEMS-configured pressure sense die 150 with a top side 105 and a back side 110. The MEMS-configured pressure sense die 150 can be fabricated utilizing silicon piezoresistive technology or capacitive technology but not limited to these technologies.

Figure 3:
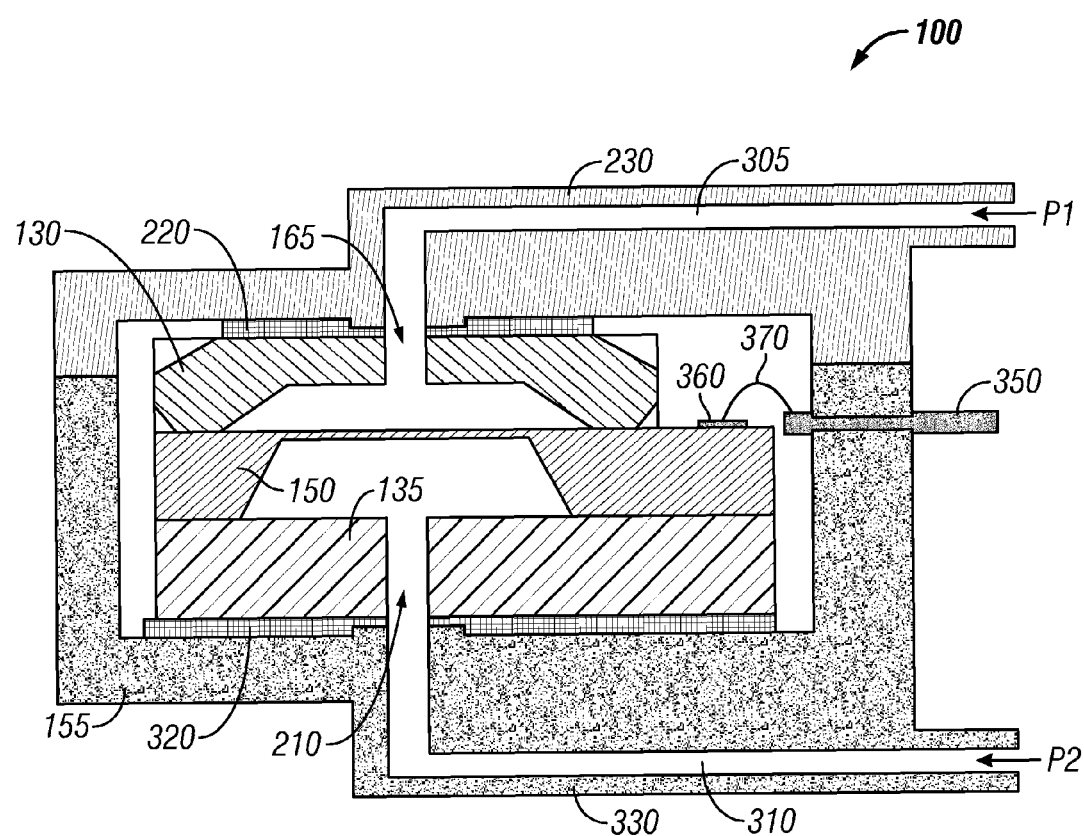
FIG. 3 illustrates a perspective view of a wet-wet differential pressure sensor apparatus, in accordance with a preferred embodiment.

In a preferred embodiment a diaphragm 115 can be etched from the pressure sense die 150 such that one or more piezoresistors 120 can be located on pressure sense die 150. A top cap 130 can be attached to the top side 105 of the pressure sense die 150 utilizing well-known wafer bonding approaches such as, for example, anodic bonding and/or glass frit bonding. Before attachment of the top cap 130 a separate hole 165 can be etched or drilled through the top cap 130 as shown in FIG. 3. The top cap 130 may be configured from a material such as, for example, silicon or glass but not limited to these materials. The top cap 130 can protect the wirebonds 370, bonding pads 360 and other exposed circuitry from exposure to the sensed media, thereby avoiding damage to the sensor.

The sensor die 150 can also be configured to incorporate a Wheatstone bridge circuit configuration, referred to simply as a "Wheatstone bridge". One or more piezoresistors (e.g., 4 piezoresistors) such as piezoresistors 120 can be embedded in the diaphragm 115 at locations that maximize the output of the sensor's Wheatstone bridge (not shown). As shown in FIG. 1 a first pressure is applied to the sense die 150 through hole 165 as indicated by arrow P1. A second pressure P2 can be applied to the back side 110 of the sensor die 150. In this way a differential pressure measurement is obtained. On the other hand, the sense die 150 can also communicate with the ambient environment (e.g., through the hole 165), so that either of the pressures P1 or P2 can be utilized as an atmospheric pressure reference to provide a gauge pressure measurement.

Figure 2:
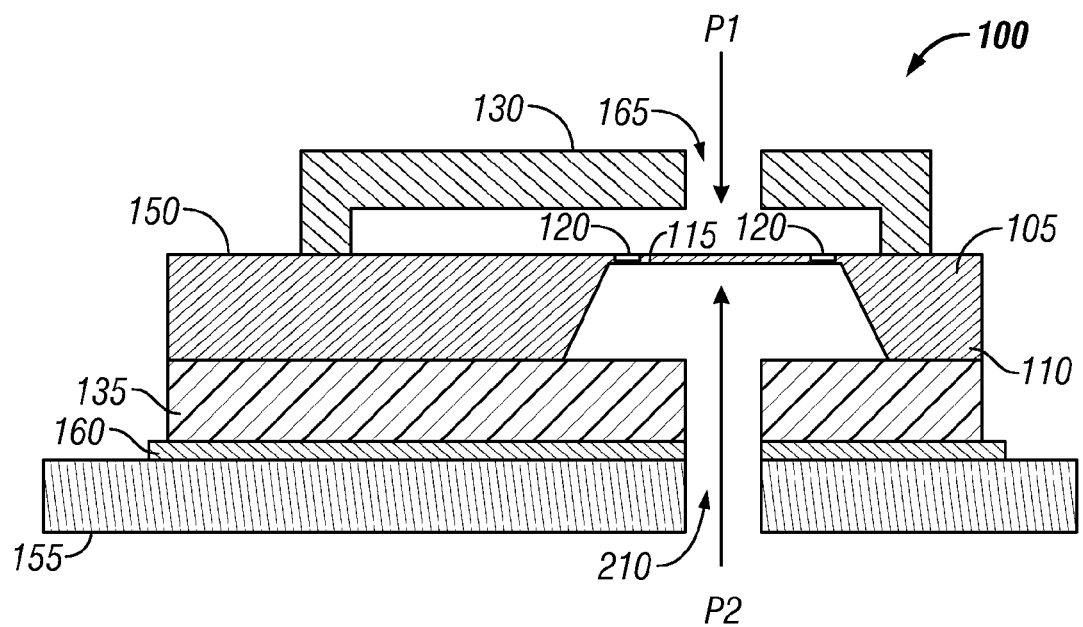
FIG. 2 illustrates a cross sectional view of the MEMS-configured pressure sensor with a constraint for wet-wet applications, in accordance with a preferred embodiment.

Referring to FIG. 2 a cross sectional view of the differential pressure sensor 100 with a constraint 135 for wet-wet applications is illustrated, in accordance with a preferred embodiment. A constraint 135 can be attached to the backside 110 of the pressure sense die 150 for stress relief utilizing well-known wafer bonding approaches such as, for example, anodic bonding and/or glass frit bonding. The constraint 135 may be configured from a material such as, for example, silicon or glass but not limited to these materials. Other types of materials may be utilized in place of these materials.

A separate hole 210 can be etched or drilled through the constraint 135 and can be at least partially aligned with a hole in pressure port P2 (not shown). Those of skill in the art will recognize that by forming holes 165 and 210 through the top cap 130 and the constraint 135, the method described herein can be utilized to fabricate a differential pressure sensor package for wet-wet applications where the media on the both sides of the sense element are wet. The media from the pressure port P1 and P2 are applied through the opening 165 and 210.

In one preferred embodiment the silicon cap 130 and the constraint 135 can be bonded to the silicon pressure die 150 using a glass frit bonding process. Bonding of silicon to silicon can minimize thermal mismatch created by bonding dissimilar material. Depending on the particular application, the quality of a bonding method can be judged on the criteria such as bonding precision, mechanical strength and thermal properties. Most wafer bonding processes are carried out at a much higher temperature than the operating temperature of the differential pressure sensor, which creates a high-temperature rated interface. The differential pressure sense die 150 can also be bonded to a substrate 155 with standard die attach materials 160. The die attach material can be configured from adhesives and/or composed of, for example, silicone, epoxy or solder. The die attach material can be utilized for isolating stress in the differential pressure sensor 100.

FIG. 3 illustrates a perspective view of a wet-wet differential pressure sensor 100, in accordance with a preferred embodiment. The wet-wet differential pressure sensor 100 can be utilized in wet/wet applications where both sides of the sense element 150 being exposed to the sensed media such as water or oil. The top cap 130 with the hole 165 can be attached to a top package cap 230 utilizing a topside seal 220. A topside pressure port 305 of the MEMS-configured pressure sense die 150 with the pressure sensing diaphragm 115 allows the sensed media with pressure P1 to come in contact with the top side 105 of the pressure sensing diaphragm 115.

The gasket or media seal 220 provide a pressure seal to the topside surface of the top cap 130. The optional constraint 135 with the hole 210 for stress relief can be attached to a bottom package cap 330 utilizing the bottom side seal 320. It should be noted that the top side seal 220 and the bottom side seal 320 can be accomplished with multiple materials such as a compressed elastomeric gasket or adhesive material or several other common techniques utilized in the sensor manufacturing industry. A bottom side pressure port 310 of the MEMS-configured pressure sense die 150 allows the sensed media with pressure P2 to come in contact with the bottom side 110 of the pressure sensing diaphragm 115. The gasket or other media seal 320 provide a pressure seal to the bottom side surface of the constraint 135. The diaphragm 115 can be incorporated with piezoresistive elements 120 that can receive the stress or media pressure applied on the diaphragm 115. The piezoresistive elements 120 can convert the applied pressure into electrical signals using well-known piezoresistive principles. The bond pads 360 can provide an external electrical connection for the diaphragm 115. Such bond pads 360 can preferably comprise aluminum or gold metallization.

The top cap 130 can seal the media from the bond pads 360 in order to avoid creation of harsh environment for the exposed bond pads 360. Thus, the differential pressure sensor 100 can operate reliably and accurately sense the media pressure. The die attach or gasket 220 and 320 can be utilized to seal the pressure sense die 150 allowing media to be sensed to come in contact with both sides of the pressure-sensing diaphragm 115 without affecting the wirebond pads 360, wirebonds 370, and the package terminals 350. Such microelectronic packaging processes yield a high performance and cost effective solution that has true wet-wet pressure sensing capability.

Each pressure port 305 and 310 can carry media at different pressures. The difference between pressures in each pressure ports 305 and 310 can be measured by exposing both sides of the silicon pressure-sensing diaphragm 115 to the media. In such a way the differential pressure sensor 100 can sense the differential pressure in media, including but not limited to water, fuel, oil, acids, bases, solvents and corrosive gases.

Figure 4:
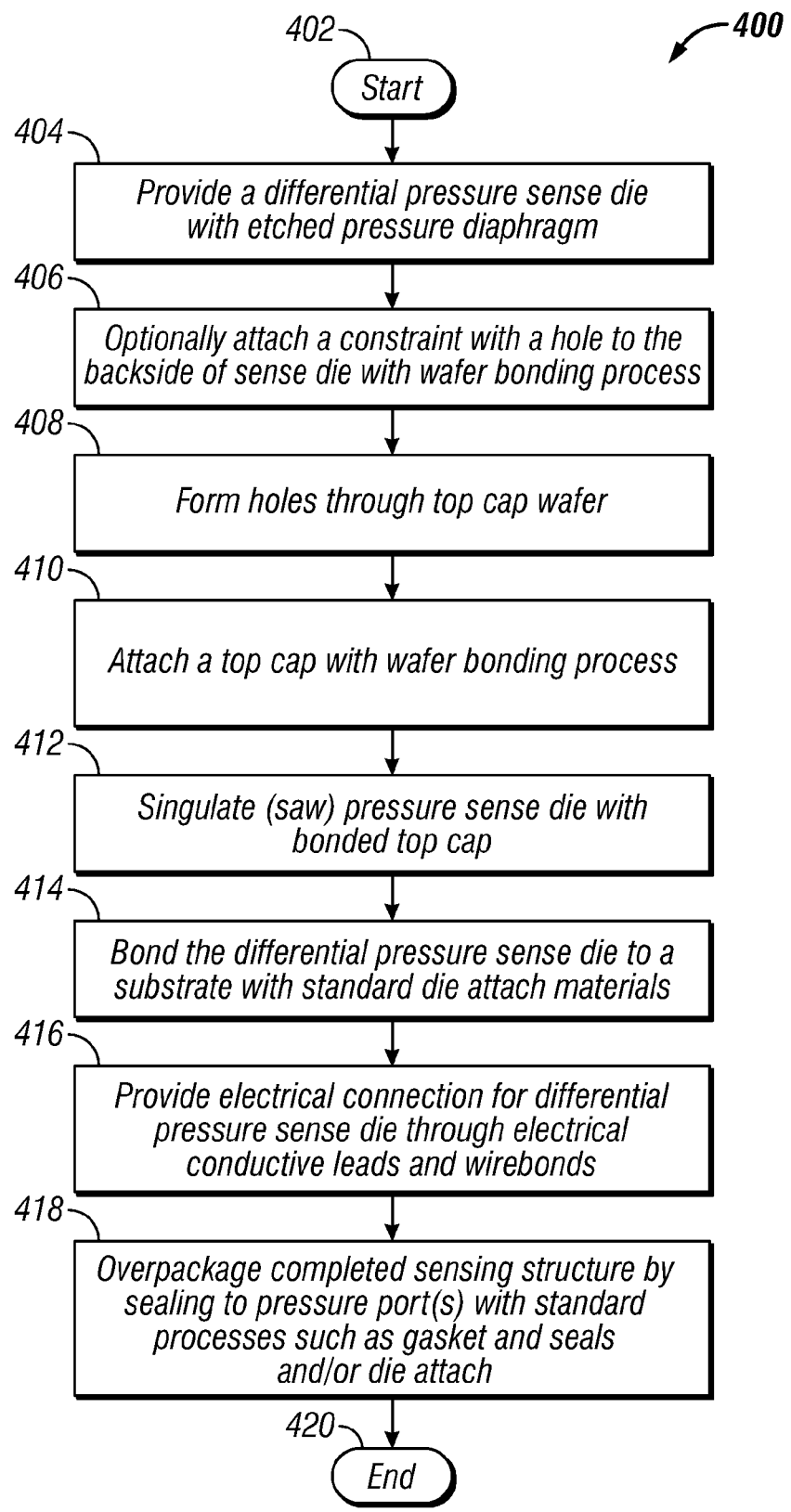
FIG. 4 illustrates a high level flow chart of operations illustrating logical operational steps of a method for assembling the wet-wet differential pressure sensor with media isolated electrical connections based on microelectronic packaging process, in accordance with a preferred embodiment.

Referring to FIG. 4, a high level flow chart of operations illustrating logical operational steps of a method 400 for assembling the wet-wet differential pressure sensor 100 with media isolated electrical connections based on microelectronic packaging process is illustrated, in accordance with one possible embodiment. In the example methodology depicted in FIG. 4, the process can begin as indicated at block 402. Next, as illustrated at block 404, a differential pressure sense die 150 with etched pressure diaphragm 115 can be provided, as indicated. Next, as depicted at block 406, an operation may be implemented in which a constraint with a hole is optionally attached to the backside of the sense die via a wafer bonding process. Next, as illustrated at block 408, one or more holes can be formed through the top cap 130 wafer. Thereafter, as depicted at block 410, the top cap 130 can be attached utilizing a wafer bonding process. Next, as described at block 412, an operation can be implemented to singulate (saw) the pressure sense die with the bonded top cap 130. Next, as indicated at block 414, the differential pressure sense die 150 can be bonded to a substrate by a standard die attach process. Thereafter, as depicted at block 416, electrical connections for the differential pressure sense die can be provided through electrical conductive leads and wire bonds. Following processing of the operation depicted at block 416, an operation can be implemented for over-packaging the completed sensing structure by sealing to pressure port(s) with standard processes such as, for example, gasket and/or die attach, as illustrated at block 418. Finally, the process can terminate, as indicated at block 420.

Note that in a preferred embodiment, the top cap wafer would already have the holes pre-etched or pre-drilled at wafer level prior to bonding it to the pressure die wafer. By the same token, the hole in the constraint is preferably pre-etched or pre-drilled at wafer level prior to bonding the constraint wafer to the pressure die wafer.

Thus, according to the methodology depicted in FIG. t, the constraint 135 with the hole 210 can be attached to the backside of the pressure sense die 150, as depicted at block 440. The differential pressure sense die 150 can be bonded to the substrate 155 with standard die attach processes. The electrical connections for differential pressure die 150 can be provided through wire bond pads 360, wire bonds 370 and terminals 350. The sensing die 150 with topside cap 130 can be over packaged with the topside port 230 and the backside port 330 utilizing gasket or media seal 220 and 330 to yield a high performance and cost effective solution that has true wet-wet pressure sensing capability.

In particular, the wet/wet differential pressure sensor 100 can apply the media on both the top and bottom sides of the diaphragm 115 for measurement, recording and analysis of the fluid pressure. Electronic systems utilized for obtaining measurements from the differential pressure sensor 100 for further analysis and recording are well known to those skilled in the art. Such differential pressure sensors 100 can utilize a top cap 140 to prevent the topside of the sensor pressure die 150, in particular bond pads 360, from being exposed to harsh or corrosive media, which provides a more robust and reliable sensing output for wet/wet applications.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A pressure sensor apparatus, comprising:
   a pressure sense die with a pressure sensing diaphragm, the pressure sense die having a top side that includes a plurality of wirebonding pads;
   a top cap having a hole formed therein, said top cap attached to the topside of the pressure sense die, wherein said top cap isolates a sensed media from the plurality of wirebonding pads; and
   an outer package sealed relative to the topside of the top cap, the outer package overpackaging said pressure sense die in order to allow said sensed media to come into contact with said pressure sensing diaphragm without coming into contact with said plurality of wirebonding pads.

2. The apparatus of claim 1 further comprising a constraint including a hole formed therein attached to a bottom side of said pressure sensing die to provide stress relief to the pressure sensing diaphragm.

3. The apparatus of claim 2 wherein said top cap and said constraint comprises silicon and/or glass.

4. The apparatus of claim 1 wherein said top cap is attached to said pressure sensing die utilizing a wafer bonding process.

5. The apparatus of claim 1 wherein said pressure sense die is bonded to a substrate utilizing a die attach process.

6. The apparatus of claim 4 wherein said wafer bonding process comprises an anodic bonding process and/or a glass frit bonding process.

7. The apparatus of claim 1 further comprising a seal between the topside of said top cap and the outer package.

8. The apparatus of claim 1 wherein said pressure sense die is fabricated utilizing a silicon piezoresistive technology and/or a capacitive technology.

9. A differential pressure sensor apparatus, comprising;
a pressure sense die with a pressure sensing diaphragm, the pressure sense die having a top side that includes a plurality of wirebonding pads and a bottom side;
a top cap having a hole formed therein, said top cap attached to the topside of the pressure sense die, wherein said top cap isolates a sensed media from the plurality of wirebonding pads;
a constraint with a hole formed therein attached to a bottom side of said pressure sensing die to provide stress relief to said pressure sensing diaphragm; and
an outer package sealed relative to the topside of the top cap, the outer package overpackaging said pressure sense die in order to allow said sensed media to come into contact with a top side of said pressure sensing diaphragm without coming into contact with said plurality of wirebonding pads of said pressure sense die, the outer package further configured to allow a sensed media to come into contact with a bottom side of said pressure sensing diaphragm via the hole in the constraint, thereby providing a differential pressure sensor apparatus having a wet-wet pressure sensing capability.

10. The apparatus of claim 9 wherein:
said top cap is attached to said pressure sensing die utilizing a wafer bonding process, wherein said wafer bonding process comprises an anodic bonding process and/or a glass frit bonding process; and
said top cap and said constraint comprises silicon and/or glass.

11. The apparatus of claim 9 wherein said pressure sense die is bonded to said constraint utilizing a die attach process.

12. The apparatus of claim 9 further comprises a seal between the topside of said top cap and the outer package.

13. A method for assembling a wet/wet differential pressure sensor, comprising;
attaching a top cap having a hole formed therein to a topside of a MEMS-configured pressure sense die comprising a pressure sensing diaphragm, wherein said top cap isolates a sensed media from a plurality of wirebonding pads on a top side of the MEMS-configured pressure sense die; and
sealing an outer package with a top side of the top cap, the outer package allowing said sensed media to come in contact with a top side of said pressure sensing diaphragm without coming into contact with said plurality of wirebonding pads and also allowing a sensed media to come into contact with a bottom side of said pressure sensing diaphragm.

14. The method of claim 13 further comprising attaching a constraint with a hole formed therein to a bottom side of the pressure sensing die, the constraint providing stress relief to said pressure sensing diaphragm.

15. The method of claim 14 wherein said wafer bonding process comprises an anodic bonding process and/or a glass frit bonding process.

16. The method of claim 13 further comprising attaching said top cap to said MEMS-configured pressure sensing die utilizing a wafer bonding process.

17. The method of claim 16 wherein said top cap and said constraint comprises silicon and/or glass.

18. The method of claim 13 further comprising:
bonding said MEMS-configured pressure sense die to a substrate utilizing a die attach process.

19. The method of claim 13 wherein said sealing step include inserting a gasket and/or adhesive seal between the outer package and a top side of said top cap.

20. The method of claim 13 further comprising fabricating said MEMS-configured pressure sense die utilizing a silicon piezoresistive technology and/or a capacitive technology.

* * * * *